(12) United States Patent
Watai

(10) Patent No.: US 11,840,267 B2
(45) Date of Patent: Dec. 12, 2023

(54) CONTROL DEVICE FOR RAILWAY VEHICLE

(71) Applicant: MITSUBISHI ELECTRIC CORPORATION, Tokyo (JP)

(72) Inventor: Atsuki Watai, Tokyo (JP)

(73) Assignee: MITSUBISHI ELECTRIC CORPORATION, Tokyo (JP)

(*) Notice: Subject to any disclaimer, the term of this patent is extended or adjusted under 35 U.S.C. 154(b) by 733 days.

(21) Appl. No.: 16/982,237

(22) PCT Filed: Mar. 27, 2018

(86) PCT No.: PCT/JP2018/012277
§ 371 (c)(1),
(2) Date: Sep. 18, 2020

(87) PCT Pub. No.: WO2019/186673
PCT Pub. Date: Oct. 3, 2019

(65) Prior Publication Data
US 2021/0221407 A1    Jul. 22, 2021

(51) Int. Cl.
*E05B 65/00* (2006.01)
*B61C 17/00* (2006.01)
(Continued)

(52) U.S. Cl.
CPC ............ *B61C 17/00* (2013.01); *H05K 5/0221* (2013.01); *B60L 2200/26* (2013.01); *H05K 5/03* (2013.01); *H05K 7/1432* (2013.01)

(58) Field of Classification Search
CPC ........ B61C 17/00; H05K 5/03; H05K 5/0221; E05B 83/02; E05B 83/363
See application file for complete search history.

(56) References Cited

U.S. PATENT DOCUMENTS

| 3,961,744 A | * | 6/1976 | Kashuba, Jr. | ............. G07F 9/06 232/16 |
| 6,857,300 B1 | * | 2/2005 | Heeley | .................. E05B 13/004 70/210 |

(Continued)

FOREIGN PATENT DOCUMENTS

| JP | S62157672 U | 10/1987 |
| JP | 2001044659 A | 2/2001 |

OTHER PUBLICATIONS

International Search Report (with English Translation) and Written Opinion issued in corresponding International Patent Application No. PCT/JP2018/012277, 9 pages (dated Jun. 26, 2018).
(Continued)

*Primary Examiner* — Dalena Tran
(74) *Attorney, Agent, or Firm* — BUCHANAN INGERSOLL & ROONEY PC

(57) ABSTRACT

A control device for a railway vehicle includes a housing and a cover covering an opening. The cover is provided with a lock and a restricting member. The restricting member is located in one of a lock permitting position for permitting locking of the cover and a lock restricting position for restricting locking of the cover. The control device further includes an urging member that urges the restricting member to the lock restricting position. When the cover closes the opening, a pushing member pushes the restricting member to the lock permitting position, resulting in permission of locking of the cover.

16 Claims, 11 Drawing Sheets

(51) Int. Cl.
  *H05K 5/02*      (2006.01)
  *H05K 5/03*      (2006.01)
  *H05K 7/14*      (2006.01)

(56) References Cited

U.S. PATENT DOCUMENTS

| | | | | |
|---|---|---|---|---|
| 8,302,783 B1 * | 11/2012 | Harris | ...................... | A47F 1/06 |
| | | | | 211/59.3 |
| 9,447,610 B2 * | 9/2016 | Ou | ........................... | E05C 1/16 |
| 10,792,074 B2 * | 10/2020 | Jackson | ............. | A61B 17/7037 |

OTHER PUBLICATIONS

Office Action dated Jul. 26, 2021, issued for corresponding Indian Patent Application No. 202027040374, 6 pages.

\* cited by examiner

CONTROL DEVICE FOR RAILWAY VEHICLE

TECHNICAL FIELD

The present disclosure relates to a control device for a railway vehicle.

BACKGROUND ART

Control devices for railway vehicles include housings having waterproofness and dust resistance. Each of the housings accommodates a control unit for controlling a railway vehicle. The control unit includes a power converter, a circuit breaker, a transformer, a reactor, and other components. The housing is provided with an opening that allows for inspection and maintenance of the control unit inside the housing. The housing is also provided with a cover that covers the opening. In order to ensure the safety, the housing has an interlock mechanism that permits locking of the cover only in the closed state of the cover.

A high-voltage device box for an electric railway vehicle disclosed in Patent Literature 1 is provided with an inspection cover that can be opened or closed. This high-voltage device box for an electric railway vehicle has interlock mechanisms composed of a first lock mechanism, a second lock mechanism, and a third lock mechanism. In the first lock mechanism, a locking bar swings and causes a claw swinging with the locking bar to engage with a hole of a receiving fitting attached to the inspection cover, thereby locking the inspection cover. The second lock mechanism permits swinging of the locking bar of the first lock mechanism only in the closed state of the inspection cover. The third lock mechanism includes a lock and an operating lever that cooperates with the locking bar of the first lock mechanism. The operating lever of the third lock mechanism has a lock hole. The lock of the third lock mechanism has a lock pin. A key is inserted in a keyhole of the lock while the inspection cover is locked by simultaneous swinging of the locking bar and the operating lever. When this key is turned, the lock pin is inserted in the lock hole of the operating lever. The lock pin inserted in the lock hole of the operating lever restricts swinging of the operating lever and thereby also restricts swinging of the locking bar. While swinging of the locking bar is restricted, the key can be extracted from the keyhole of the lock. In the high-voltage device box for an electric railway vehicle disclosed in Patent Literature 1 having the above-described structure, locking of the inspection cover is achieved by swinging of the locking bar in the closed state of the inspection cover. In addition, simultaneous swinging of the locking bar and the operating lever causes locking of the lock and allows for extraction of the key from the lock.

CITATION LIST

Patent Literature

Patent Literature 1: Unexamined Japanese Utility Model Application Publication No. S62-157672

SUMMARY OF INVENTION

Technical Problem

The high-voltage device box for an electric railway vehicle disclosed in Patent Literature 1 requires a complicated mechanism, such as a mechanism of permitting locking of the inspection cover in response to engagement of the swinging claw with the opening of the receiving fitting, or a mechanism of restricting swinging of the operating lever using the lock pin inserted in the lock hole of the operating lever.

In consideration of such circumstances, an objective of the present disclosure is to provide a simplified interlock mechanism.

Solution to Problem

In order to achieve the above objective, a control device for a railway vehicle according to an aspect of the present disclosure includes a housing, a cover, and an interlock mechanism. The housing is provided with an opening. The cover closes or opens the opening. The interlock mechanism permits locking of the cover while the cover is closed, and restricts locking of the cover while the cover is open. The interlock mechanism includes a lock, a restricting member, a pushing member, an urging member, and a bar. The lock locks the cover while the cover is closed. The restricting member is attached to one of an inner surface of the housing and an inner surface of the cover, and is located in one of a lock permitting position for permitting locking of the cover and a lock restricting position for restricting locking of the cover. The pushing member is attached to the other of the inner surface of the housing and the inner surface of the cover. The urging member urges the restricting member to the lock restricting position. The bar is provided to the lock and is configured to swing with turning of a key inserted in the lock. In response to a closing operation of the cover, the pushing member pushes the restricting member to the lock permitting position. When the restricting member is in the lock restricting position, the restricting member is in contact with the bar and thereby restricts turning of the key and swinging of the bar, and when the restricting member is in the lock permitting position, the restricting member is not in contact with the bar and thereby permits turning of the key and swinging of the bar.

Advantageous Effects of Invention

According to the present disclosure, in response to a closing operation of the cover, the pushing member pushes the restricting member to the lock permitting position, resulting in permission of locking by the lock. The structure of this interlock mechanism is simplified.

DESCRIPTION OF EMBODIMENTS

Control devices for a railway vehicle according to embodiments of the present disclosure are described below in detail with reference to the drawings. Components that are the same or equivalent are assigned the same reference signs throughout the drawings.

Embodiment 1

Figure 1:
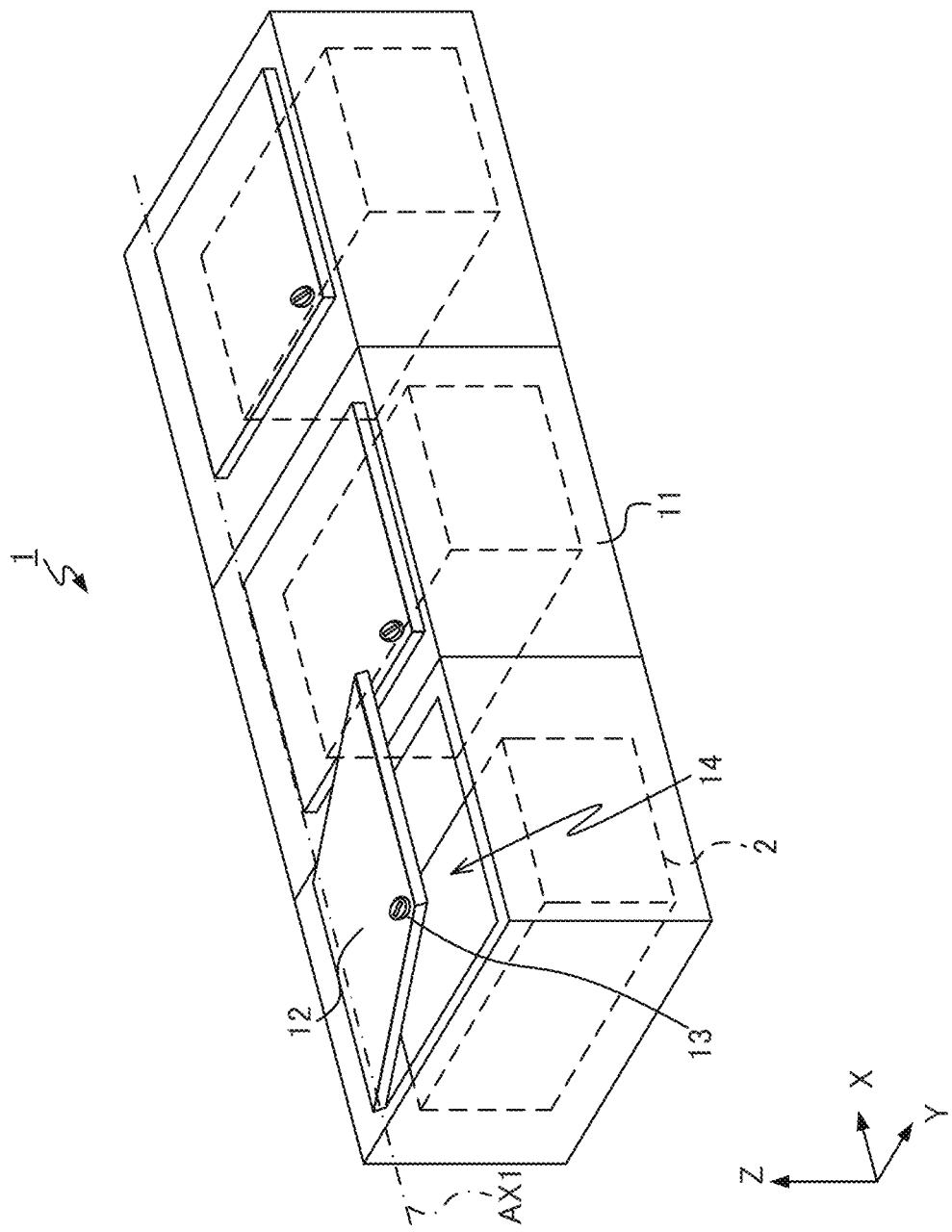
FIG. 1 is a perspective view of a control device for a railway vehicle according to Embodiment 1 of the present disclosure.

With reference to FIG. 1, a control device 1 for a railway vehicle (hereinafter referred to as "control device") includes a housing 11 and covers 12. Each of the covers 12 includes a lock 13. The cover 12 rotates about a rotational axis AX1, thereby opening or closing an opening 14 provided to the housing 11. In FIG. 1, the Z axis indicates the vertical direction. In FIG. 1, the X axis indicates the longitudinal direction of the housing 11. The housing 11 is provided with three openings 14 aligned in the X-axis direction. The Y axis is orthogonal to the X and Z axes. The covers 12 are provided for the respective openings 14. The covers 12 include the respective locks 13. These three locks 13 are manipulated independently from each other. The locks 13 lock the respective covers 12. Specifically, each of the locks 13 has a cylinder lock mechanism, in which a key, which is described later, is inserted. The cylinder lock mechanism receiving the inserted key is rotated to be in a locked position or an unlocked position. The lock 13 in the unlocked position does not allow for extraction of the key from the lock 13. While the cover 12 is closed, in response to turning of the key inserted in the cylinder lock mechanism, the cylinder lock mechanism is rotated with the key. The cylinder lock mechanism is rotated to the locked position and thereby allows for locking of the cover 12 and extraction of the key. The control device 1 has an interlock mechanism that allows for locking of the cover 12 and extraction of the key from the lock 13 only in the closed state of the cover 12.

Figure 2:
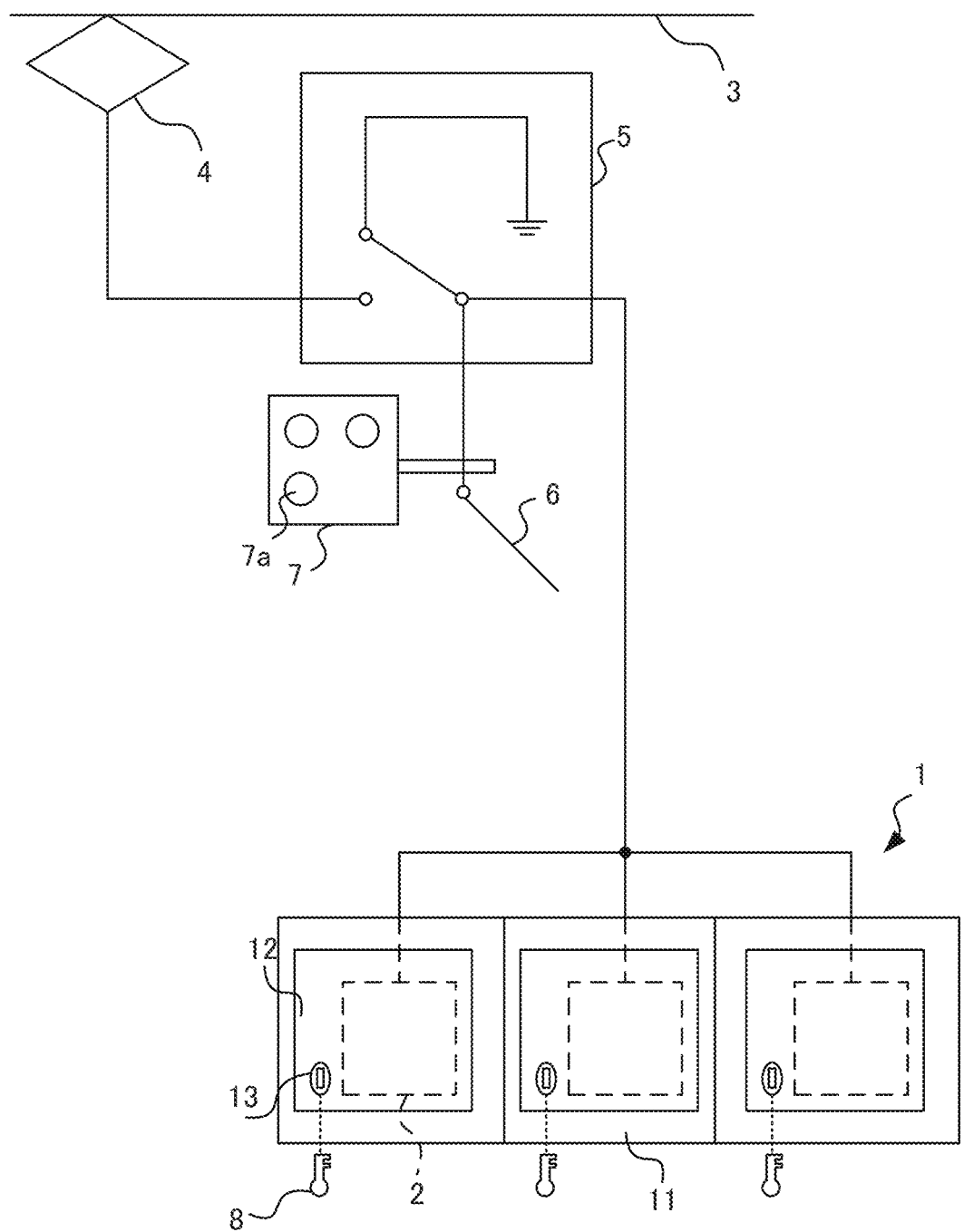
FIG. 2 illustrates a configuration of an interlock system according to Embodiment 1.

The control device 1 is installed underneath the floor of a railway vehicle. The control device 1 further includes a control unit 2 as a device for controlling the railway vehicle. The control unit 2 is accommodated in the housing 11 of the control device 1. The control unit 2 includes a power converter, a circuit breaker, a transformer, a reactor, and other components. FIG. 2 is a block diagram illustrating a configuration of an interlock system according to Embodiment 1. The electric power supplied from an overhead wire 3 via a pantograph 4 is supplied to the control unit 2 via a ground switch 5. The ground switch 5 switches the mode between an ungrounded mode, in which the control unit 2 is supplied with electric power from the overhead wire 3, and a grounded mode, in which the control unit 2 is disconnected from the overhead wire 3 and grounded. The switching of the ground switch 5 is conducted by an operation of a switch operator 6. The interlock system further includes a key retainer 7 for retaining keys 8 for the locks 13 of the control device 1. Only when the keys 8 are inserted in all the keyholes 7a of the key retainer 7, the switch operator 6 is operable to conduct the switching of the ground switch 5 such that the control unit 2 is supplied with electric power from the overhead wire 3. The control device 1 is thus activated to enable the railway vehicle to run. In addition, only when the switch operator 6 is operated to conduct the switching of the ground switch 5 such that the control unit 2 is disconnected from the overhead wire 3, the keys 8 can be extracted from the key retainer 7. The keys 8 extracted from the key retainer 7 can thus be used to unlock the covers 12.

Figure 3:
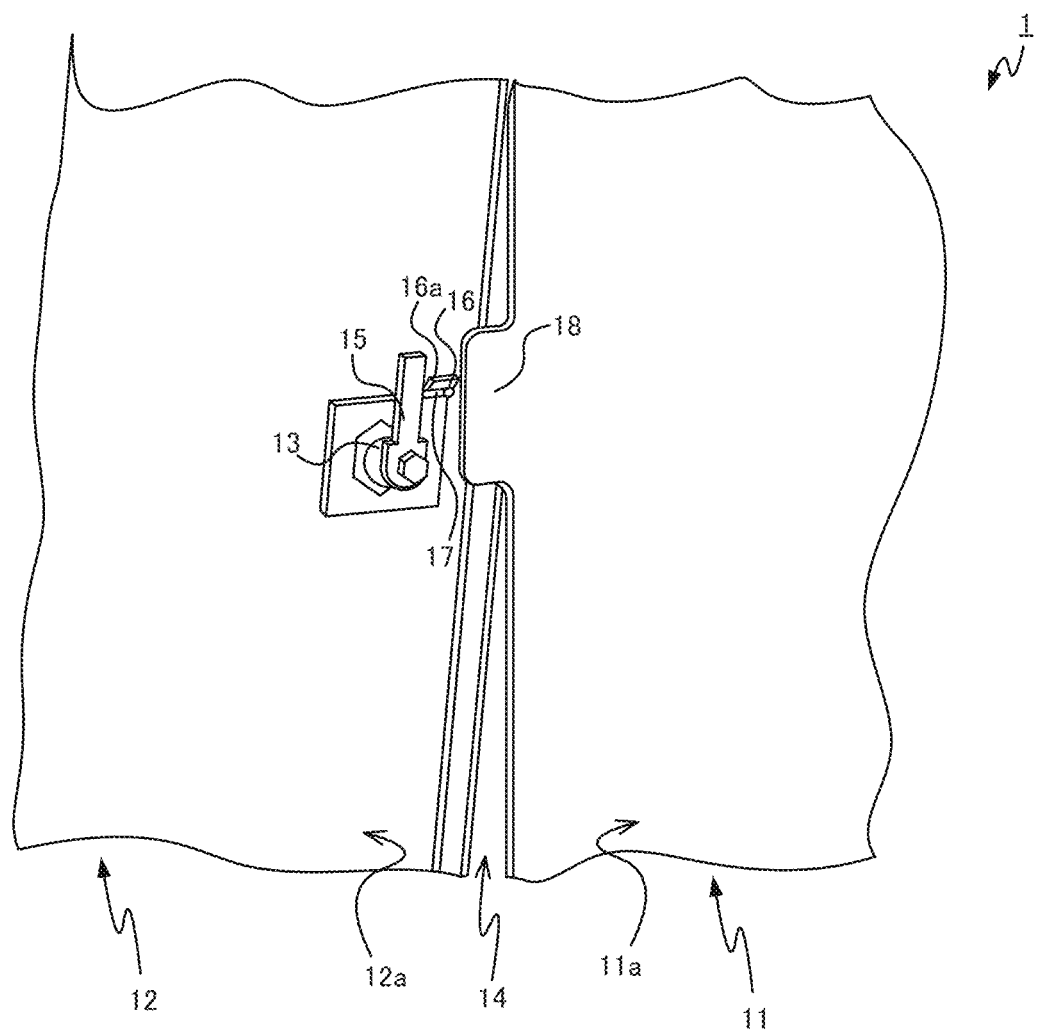
FIG. 3 illustrates a restricting member and a pushing member according to Embodiment 1.
Figure 4:
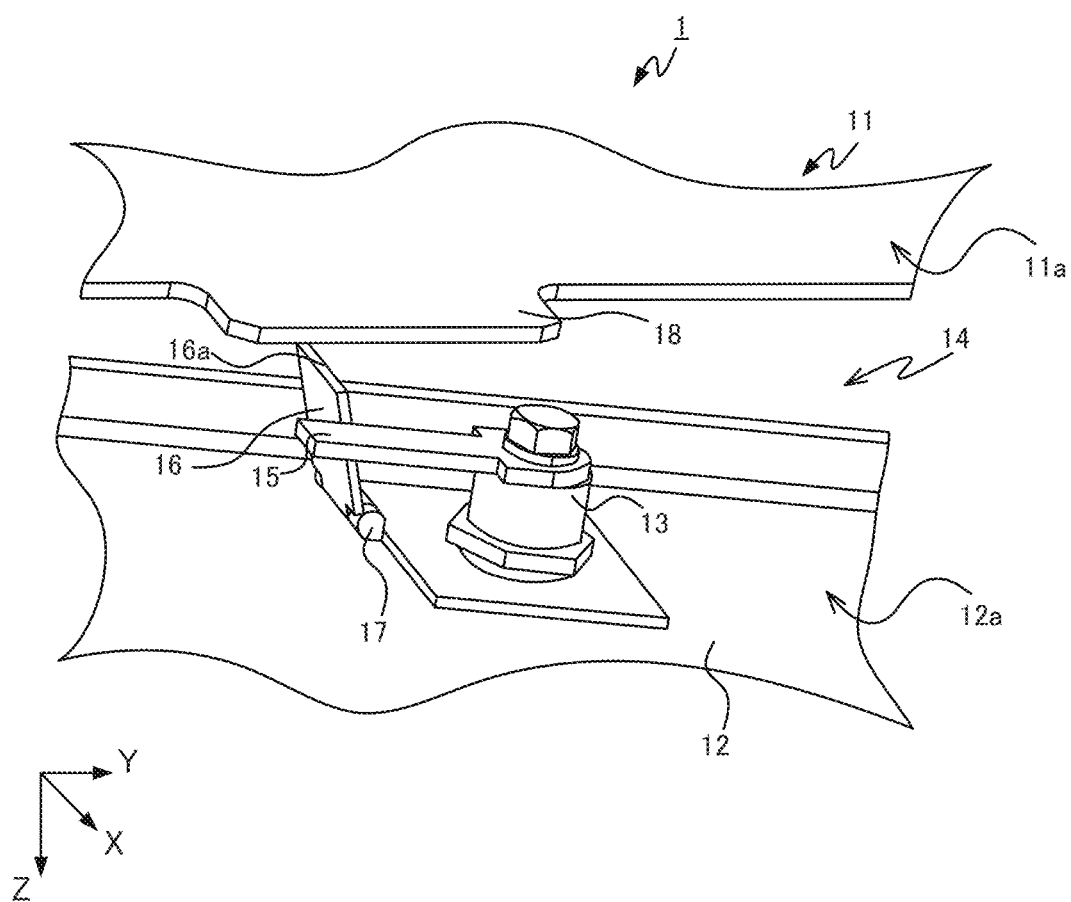
FIG. 4 illustrates the restricting member and the pushing member according to Embodiment 1.

The control device 1 has an interlock mechanism that allows for locking of the cover 12 and extraction of the key 8 only in the closed state of the cover 12, as described above. This interlock mechanism of the control device 1 is described below. FIGS. 3 and 4 illustrate a state in which the cover 12 is not closed. FIG. 3 illustrates the housing 11 and the cover 12 when viewed from the inside of the housing 11 to the outside. FIG. 4 illustrates portions of the housing 11 and the cover 12 to come into contact with each other when viewed from the inside of the housing 11. In order to facilitate an understanding, the following description is directed to only one of the three locks 13 because the locks 13 have the identical configuration. In the example illustrated in FIGS. 3 and 4, the cover 12 is unlocked. The lock 13 includes a bar 15 that swings with turning of the key 8 inserted in the lock 13. When the swinging of the bar 15 is restricted by a restricting member 16, which is described later, the interlock mechanism restricts the turning of the key 8 inserted in the lock 13, resulting in restriction of locking of the cover 12. In contrast, when the swinging of the bar 15 is permitted, the interlock mechanism allows for turning of the key 8 inserted in the lock 13, resulting in permission of locking of the cover 12.

The above-mentioned restricting member 16 is attached to an inner surface 12a of the cover 12. Specifically, the restricting member 16 is in one of a lock permitting position for permitting locking of the cover 12 and a lock restricting position for restricting locking of the cover 12. The restricting member 16 is composed of a plate member. The control device 1 further includes an urging member 17 that urges the restricting member 16 to the lock restricting position. The urging member 17 urges one end 16a of the restricting member 16 in the direction apart from the inner surface 12a of the cover 12 provided with the restricting member 16. The urging member 17 is composed on an elastic member. In the example illustrated in FIGS. 3 and 4, the restricting member 16, which is urged by the urging member 17, is in the lock restricting position. Specifically, the one end 16a of the restricting member 16 is located apart from the inner surface 12a of the cover 12 such that the restricting member 16 is in contact with the bar 15. This configuration restricts swinging of the bar 15, resulting in restriction of locking of the cover 12.

In order to achieve the above-described interlock mechanism, the control device 1 further includes a pushing member 18 attached to an inner surface 11a of the housing 11. In the example illustrated in FIGS. 3 and 4, the pushing member 18 is integrated with the housing 11 and located at a position that overlaps with the restricting member 16. Specifically, while the cover 12 is closed, at least a part of the pushing member 18 is located as a position that overlaps with at least a part of the restricting member 16 in the Z-axis direction. The pushing member 18 pushes the restricting member 16 to the lock permitting position. Specifically, the pushing member 18 pushes the restricting member 16 toward the cover 12, so that swinging of the bar 15 is permitted. This configuration permits turning of the key 8 inserted in the lock 13, resulting in permission of locking of the cover 12.

Figure 5:
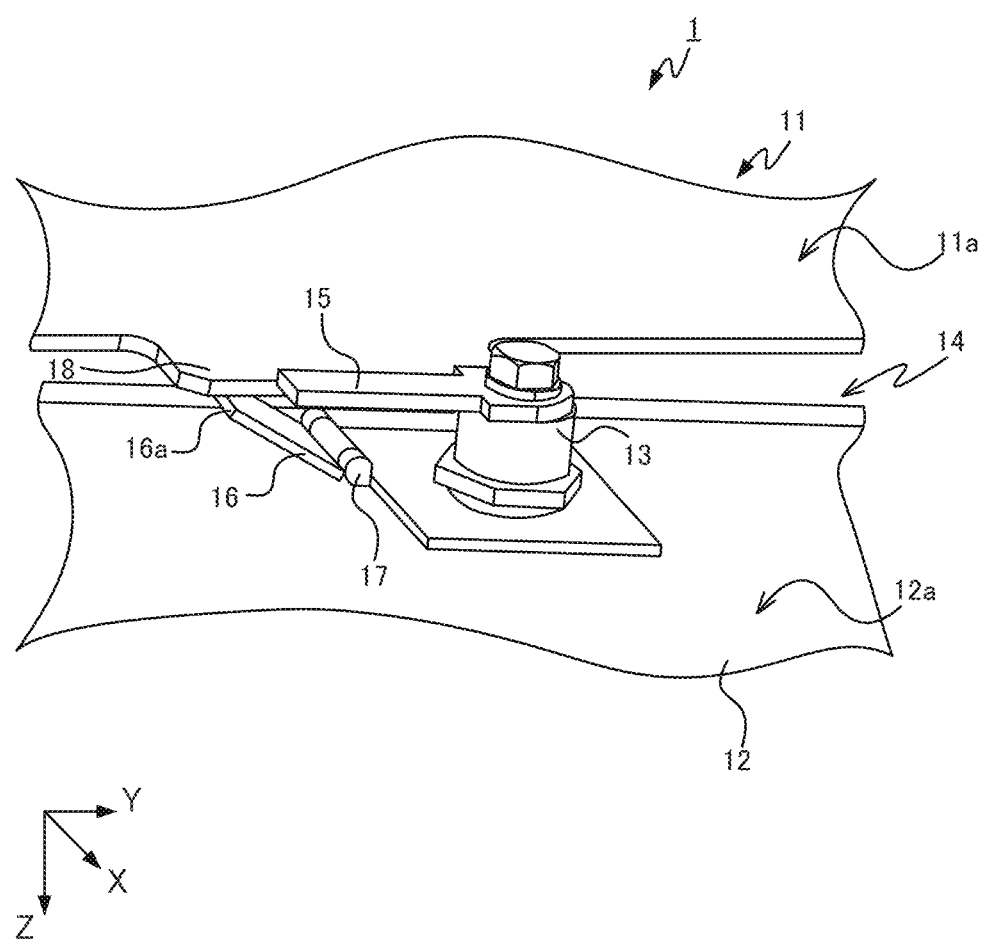
FIG. 5 illustrates the restricting member and the pushing member according to Embodiment 1.
Figure 6:
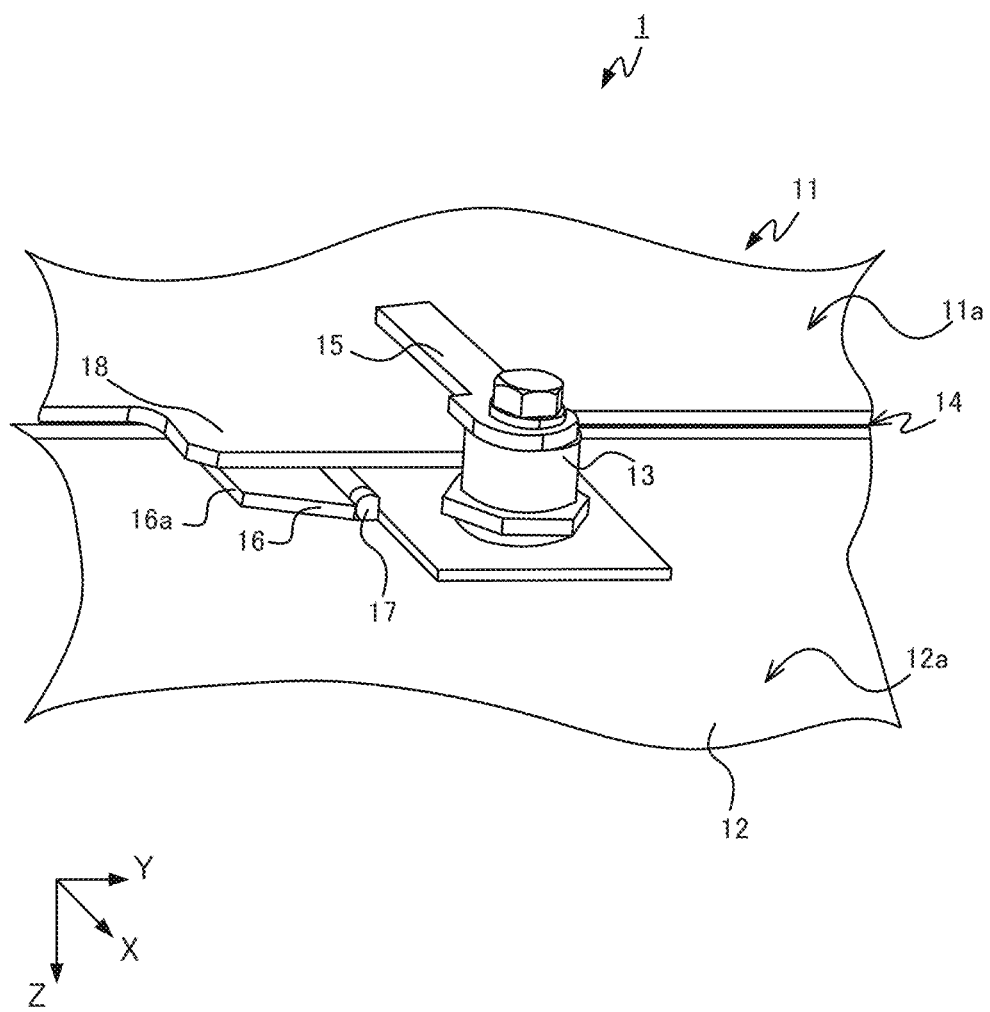
FIG. 6 illustrates the restricting member and the pushing member according to Embodiment 1.

In the control device 1 having the above-described configuration, locking of the cover 12 is available in the closed state of the cover 12. FIGS. 5 and 6 illustrate a state in which the cover 12 is closed. FIGS. 5 and 6 illustrate portions of the housing 11 and the cover 12 to come into contact with each other when viewed from the inside of the housing 11. During a closing operation of the cover 12, the restricting member 16, which is urged by the urging member 17 in the direction apart from the inner surface 12*a* of the cover 12, comes into contact with the pushing member 18. When the cover 12 is further closed, the pushing member 18 pushes the restricting member 16 toward the cover 12, so that the one end 16*a* of the restricting member 16 approaches the inner surface 12*a* of the cover 12. The restricting member 16 thus is not in contact with the bar 15, and allows for swinging of the bar 15 and turning of the key 8 inserted in the lock 13, resulting in permission of locking of the cover 12. That is, the restricting member 16 allows the cover 12 to be locked. In other words, the pushing member 18 pushes the restricting member 16, so that the bar 15 is able to swing from the position illustrated in FIG. 5 to the position illustrated in FIG. 6. The key 8 inserted in the lock 13 can thus be turned and lock the cover 12. After turning of the key 8 and locking of the cover 12, the key 8 can be extracted.

The pushing member 18 pushes the restricting member 16 and thereby displaces the restricting member 16 from the lock restricting position to the lock permitting position, resulting in permission of locking of the cover 12, as described above. The interlock mechanism of the control device 1 does not require a complicated mechanism, such as a mechanism of permitting locking of an inspection cover in response to engagement of a swinging claw with an opening of a receiving fitting, or a mechanism of restricting swinging of an operating lever using a lock pin inserted in a lock hole of the operating lever. The structure of the interlock mechanism therefore is simplified. Also, the control device 1 has a production tolerance higher than that of a device having the above-mentioned complicated mechanism.

As described above, the control device 1 according to Embodiment 1 of the present disclosure has a simplified interlock mechanism, in which the pushing member 18 comes into contact with the restricting member 16 in response to a closing operation of the cover 12, resulting in permission of locking of the cover 12.

Embodiment 2

Figure 7:
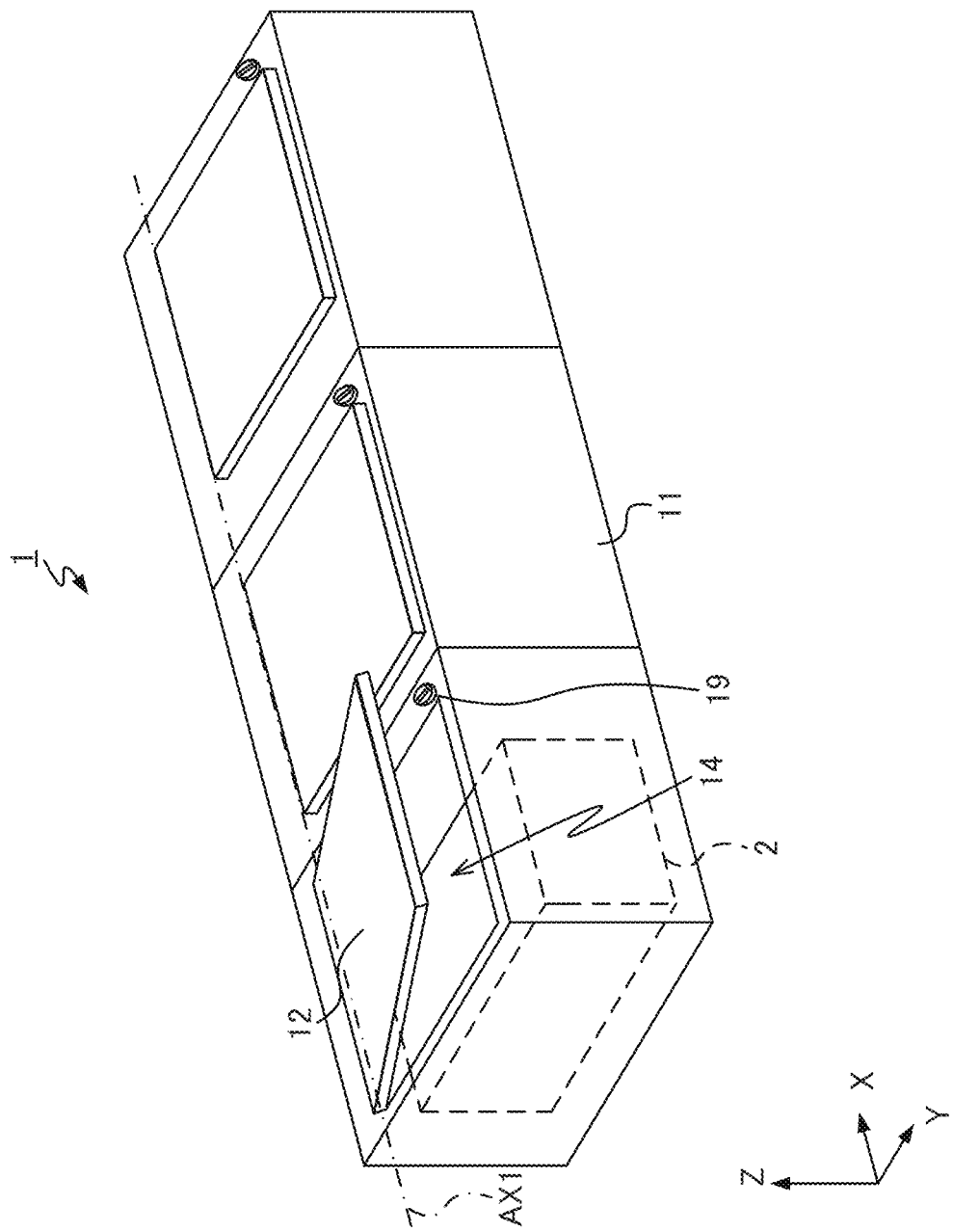
FIG. 7 is a perspective view of a control device for a railway vehicle according to Embodiment 2 of the present disclosure.

Although the locks 13 and the restricting members 16 are attached to the covers 12 and the pushing members 18 are attached to the housing 11 according to an example of Embodiment 1, these attachment positions are a mere example. The following description is directed to the control device 1, in which locks and restricting members are attached to the housing 11 and pushing members are attached to the covers 12. The control device 1 according to Embodiment 2 differs from the control device 1 according to Embodiment 1 in the attachment positions of the locks and the restricting members. The interlock system including the control device 1 has the configuration identical to that illustrated in FIG. 2. According to Embodiment 2, the housing 11 is provided with locks 19, as illustrated in FIG. 7. The control device 1 according to Embodiment 2 has an interlock mechanism that allows for locking of the cover 12 and extraction of the key 8 from the lock 19 only in the closed state of the cover 12, as in Embodiment 1. The locks 19 have the mechanism identical to that of the locks 13 according to Embodiment 1.

Figure 8:
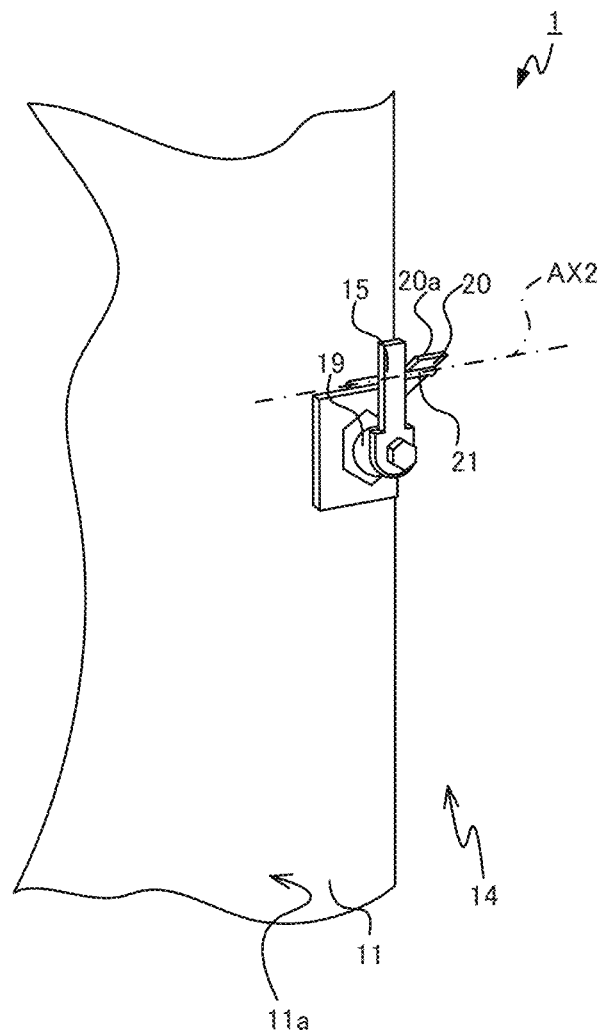
FIG. 8 illustrates a restricting member according to Embodiment 2.
Figure 9:
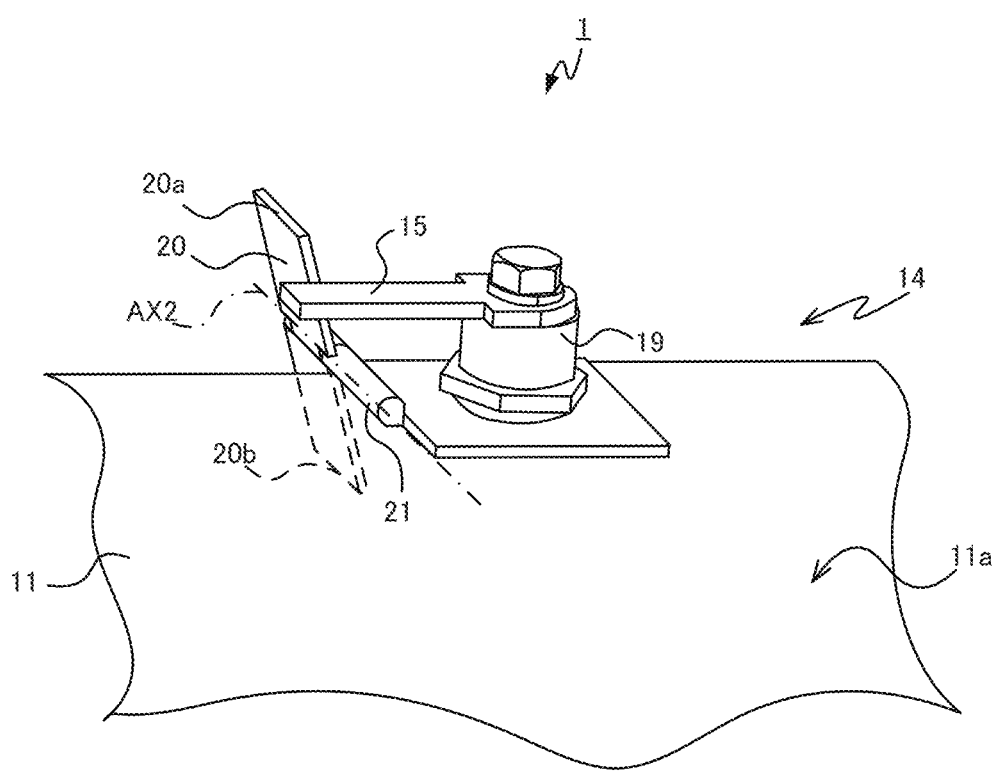
FIG. 9 illustrates the restricting member according to Embodiment 2.

The interlock mechanism of the control device 1 is described below. FIGS. 8 and 9 illustrate a state in which the cover 12 is not closed. FIG. 8 illustrates the housing 11 when viewed from the inside of the housing 11 to the outside. FIG. 9 illustrates a portion of the housing 11 to come into contact with the cover 12 when viewed from the inside of the housing 11. In the example illustrated in FIGS. 8 and 9, the cover 12 is unlocked, and a restricting member 20, which is described later, restricts locking of the cover 12. That is, locking of the cover 12 is restricted in the example illustrated in FIGS. 8 and 9. The housing 11 includes the restricting member 20 having a plate shape. The restricting member 20 is in one of a lock permitting position for permitting locking of the cover 12 and a lock restricting position for restricting locking of the cover 12. Specifically, the restricting member 20 rotates about a rotational axis AX2 to be in the lock permitting position or the lock restricting position. The control device 1 further includes an urging member 21 that urges the restricting member 20 to the lock restricting position. The urging member 21 urges an end 20*a*, which is one end of the restricting member 20, inward of the housing 11, and urges an end 20*b*, which is the other end of the restricting member 20, outward of the housing 11. Specifically, the control device 1 includes an elastic member as the urging member 21. In the example illustrated in FIGS. 8 and 9, the restricting member 20, which is urged by the urging member 21, is in the lock restricting position.

The lock 19 includes the bar 15 that swings with turning of the key 8 inserted in the lock 19. In the example illustrated in FIGS. 8 and 9, the restricting member 20 in the lock restricting position is in contact with the bar 15 and thereby restricts swinging of the bar 15. The interlock mechanism thus restricts turning of the key 8 inserted in the lock 19, resulting in restriction of locking of the cover 12. The control device 1 further includes a pushing member 22 attached to the cover 12. The pushing member 22 is integrated with the cover 12 and corresponds to a part of the edge of the cover 12 adjacent to the housing 11.

Figure 10:
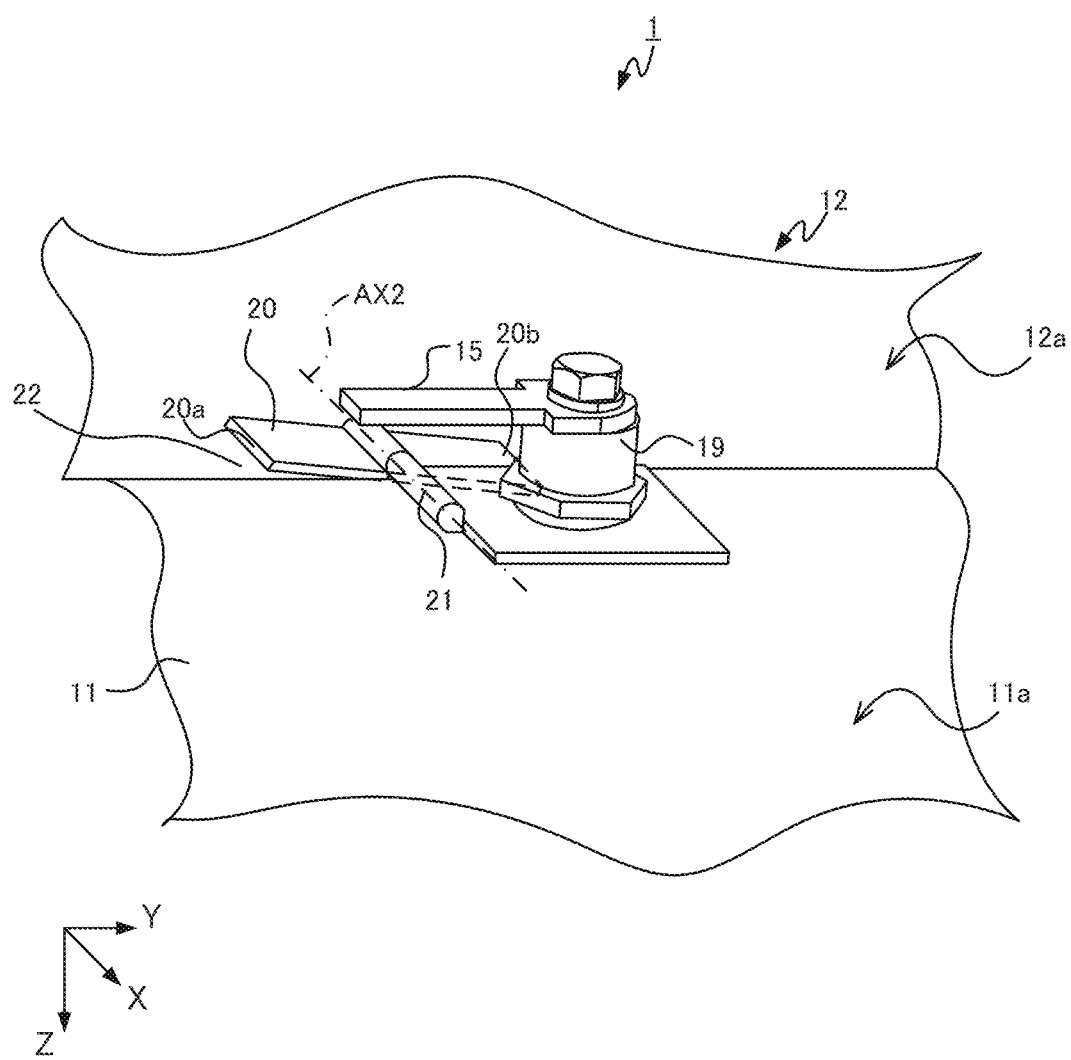
FIG. 10 illustrates the restricting member and a pushing member according to Embodiment 2.
Figure 11:
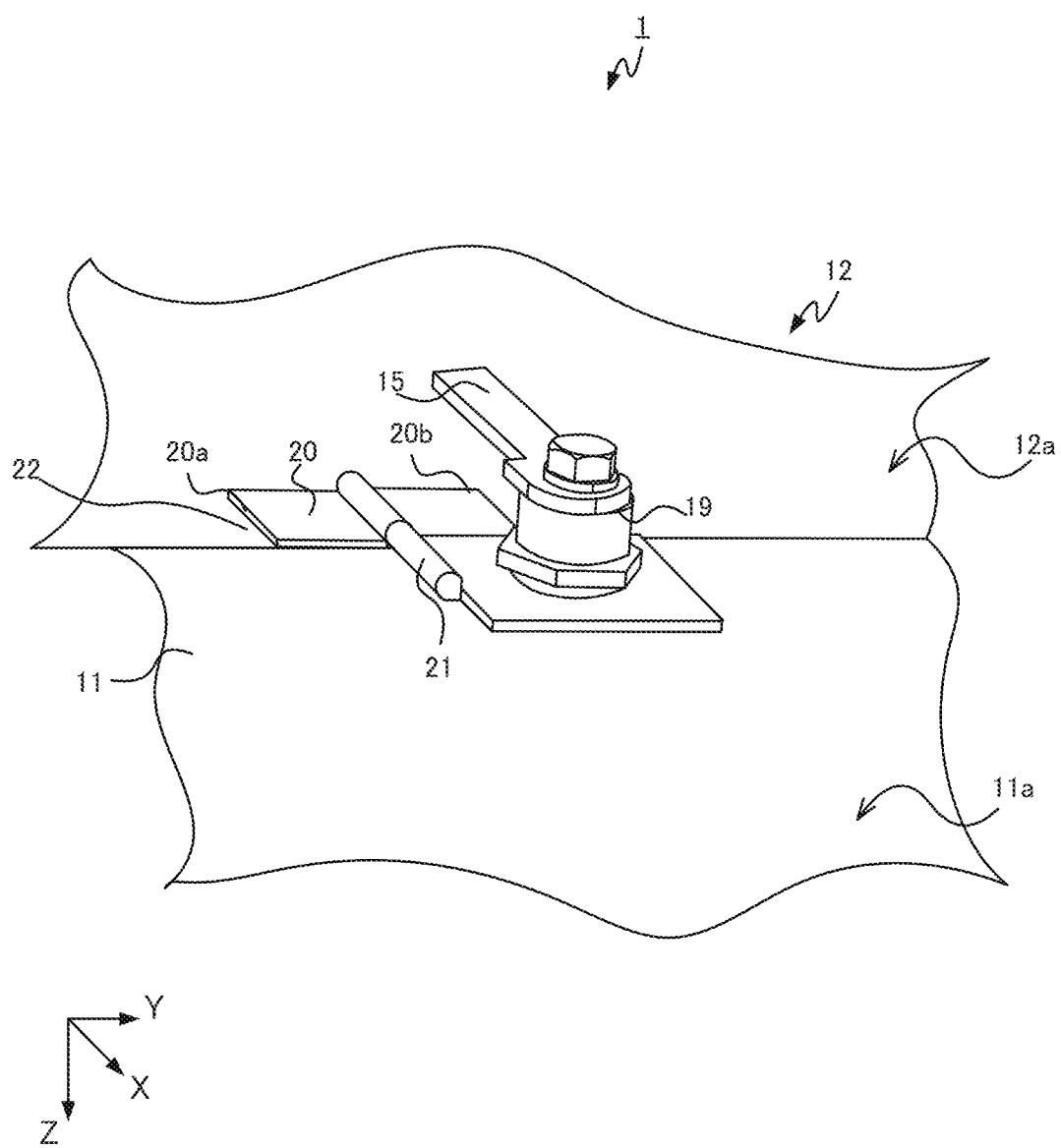
FIG. 11 illustrates the restricting member and the pushing member according to Embodiment 2.

In the control device 1 having the above-described configuration, locking of the cover 12 is available in the closed state of the cover 12. FIGS. 10 and 11 illustrate a state in which the cover 12 is closed. FIGS. 10 and 11 illustrate portions of the housing 11 and the cover 12 to come into contact with each other when viewed from the inside of the housing 11. In the example illustrated in FIGS. 10 and 11, the pushing member 22 pushes the end 20*b* of the restricting member 20. When the pushing member 22 pushes the end 20*b* of the restricting member 20, the end 20*a* is displaced from the position of contact with the bar 15 to the position of no contact with the bar 15. The restricting member 20 thus allows for swinging of the bar 15. In other words, the pushing member 22 pushes the restricting member 20, so that the bar 15 is able to swing from the position illustrated in FIG. 10 to the position illustrated in FIG. 11. The key 8 inserted in the lock 19 can thus be turned and lock the cover 12. After turning of the key 8 and locking of the cover 12, the key 8 can be extracted.

The pushing member 22 pushes the end 20*b* of the restricting member 20 and thereby displaces the restricting member 20 from the lock restricting position to the lock permitting position, resulting in permission of locking of the cover 12, as described above. The interlock mechanism of the control device 1 does not require a complicated mechanism, such as a mechanism of permitting locking of an inspection cover in response to engagement of a swinging claw with an opening of a receiving fitting, or a mechanism of restricting swinging of an operating lever using a lock pin inserted in a lock hole of the operating lever. The structure of the interlock mechanism therefore is simplified. Also, the control device 1 has a production tolerance higher than that of a device having the above-mentioned complicated mechanism.

As described above, the control device 1 according to Embodiment 2 of the present disclosure has a simplified interlock mechanism, in which the pushing member 22 comes into contact with the restricting member 20 in response to a closing operation of the cover 12, resulting in permission of locking of the cover 12.

The above-described embodiments should not be construed as limiting the present disclosure. The interlock system should not necessarily operate in association with control of the railway vehicle. The shapes of the restricting members 16 and 20 and the pushing members 18 and 22 in the above-described embodiments are mere examples. Each of the locks 13 may have a sliding mechanism in place of the above-described cylinder lock mechanism. In this case, while the cover 12 is not closed, a sliding portion of the sliding mechanism is in contact with the restricting member 16 or 20, and thereby restricts locking of the cover 12. Furthermore, the cover 12 rotatable about the rotational axis AX1 may be replaced with a slidable cover or an insertable cover, for example.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

REFERENCE SIGNS LIST

1 Control device for a railway vehicle
2 Control unit
3 Overhead wire
4 Pantograph
5 Ground switch
6 Switch operator
7 Key retainer
7*a* Keyhole
8 Key
11 Housing
11*a*, 12*a* Inner surface
12 Cover
13, 19 Lock
14 Opening
15 Bar
16, 20 Restricting member
16*a* One end
17, 21 Urging member
18, 22 Pushing member
20*a*, 20*b* End
AX1, AX2 Rotational axis

The invention claimed is:

1. A control device for a railway vehicle, comprising:
a housing provided with an opening;
a cover to close or open the opening; and
an interlock mechanism to permit locking of the cover while the cover is closed, and restrict locking of the cover while the cover is open, the interlock mechanism comprising:
a lock to lock the cover while the cover is closed;
a restricting member attached to one of an inner surface of the housing and an inner surface of the cover, the restricting member being located in one of a lock permitting position for permitting locking of the cover and a lock restricting position for restricting locking of the cover;
a pushing member attached to the other of the inner surface of the housing and the inner surface of the cover;
an urging member to urge the restricting member to the lock restricting position, and
a bar provided to the lock and configured to swing with turning of a key inserted in the lock,
wherein
in response to a closing operation of the cover, the pushing member pushes the restricting member to the lock permitting position,
when the restricting member is in the lock restricting position, the restricting member is in contact with the bar and thereby restricts turning of the key and swinging of the bar, and
when the restricting member is in the lock permitting position, the restricting member is not in contact with the bar and thereby permits turning of the key and swinging of the bar.

2. The control device according to claim 1, wherein the restricting member is a plate member, and
the urging member is an elastic member for urging one end of the restricting member inward of the housing or the cover to which the restricting member is attached.

3. The control device according to claim 2, wherein after the key inserted in the lock is turned while the cover is closed and thereby locks the cover, extraction of the key from the lock is available.

4. The control device according to claim 3, further comprising a device for controlling a railway vehicle, the device being accommodated in the housing.

5. The control device according to claim 2, further comprising a device for controlling a railway vehicle, the device being accommodated in the housing.

6. The control device according to claim 1, wherein after the key inserted in the lock is turned while the cover is closed and thereby locks the cover, extraction of the key from the lock is available.

7. The control device according to claim 6, further comprising a device for controlling a railway vehicle, the device being accommodated in the housing.

8. The control device according to claim 1, further comprising a device for controlling a railway vehicle, the device being accommodated in the housing.

9. A control device for a railway vehicle, comprising:
a housing provided with an opening;
a cover to close or open the opening; and
an interlock mechanism to permit locking of the cover while the cover is closed, and restrict locking of the cover while the cover is open, the interlock mechanism comprising:
a lock to lock the cover while the cover is closed;
a restricting member attached to one of an inner surface of the housing and an inner surface of the cover, the restricting member being located in one of a lock permitting position for permitting locking of the cover and a lock restricting position for restricting locking of the cover;

a pushing member attached to the other of the inner surface of the housing and the inner surface of the cover; and an urging member to urge the restricting member to the lock restricting position, wherein in response to a closing operation of the cover the pushing member pushes the restricting member to the lock permitting position, the restricting member is a plate member, and the urging member is an elastic member for urging one end of the restricting member inward of the housing or the cover to which the restricting member is attached, and urging another end of the restricting member outward of the housing or the cover to which the restricting member is attached.

10. The control device according to claim 9, further comprising:

a bar provided to the lock and configured to swing with turning of a key inserted in the lock, wherein when the restricting member is in the lock restricting position, the restricting member is in contact with the bar and thereby restricts turning of the key and swinging of the bar, and when the restricting member is in the lock permitting position, the restricting member is not in contact with the bar and thereby permits turning of the key and swinging of the bar.

11. The control device according to claim 10, wherein after the key inserted in the lock is turned while the cover is closed and thereby locks the cover, extraction of the key from the lock is available.

12. The control device according to claim 11, further comprising a device for controlling a railway vehicle, the device being accommodated in the housing.

13. The control device according to claim 10, further comprising a device for controlling a railway vehicle, the device being accommodated in the housing.

14. The control device according to claim 9, wherein after a key inserted in the lock is turned while the cover is closed and thereby locks the cover, extraction of the key from the lock is available.

15. The control device according to claim 14, further comprising a device for controlling a railway vehicle, the device being accommodated in the housing.

16. The control device according to claim 9, further comprising a device for controlling a railway vehicle, the device being accommodated in the housing.

* * * * *